United States Patent [19]

Le Guyader et al.

[11] 4,389,726

[45] Jun. 21, 1983

[54] ADAPTIVE PREDICTING CIRCUIT USING A LATTICE FILTER AND A CORRESPONDING DIFFERENTIAL PCM CODING OR DECODING APPARATUS

[76] Inventors: Alain Le Guyader, 40, Residence Duroux; Andre Gilloire, 7, rue Yann Peron, both of 22300 Lannion, France

[21] Appl. No.: 253,154

[22] Filed: Apr. 10, 1981

[30] Foreign Application Priority Data

Apr. 21, 1980 [FR] France .................. 80 08883

[51] Int. Cl.³ .......................... H04B 12/04
[52] U.S. Cl. ........................ 375/27; 375/30
[58] Field of Search .......... 332/11 R, 11 D; 333/18; 179/15.55 R; 358/135, 136, 260; 364/825, 852, 854, 857; 340/347 AD; 375/14, 27, 30, 31, 32; 370/118

[56] References Cited

U.S. PATENT DOCUMENTS 3,502,986  3/1970  Lucky ........................ 375/7
4,144,543  3/1979  Koga .......................... 358/136

Primary Examiner—Benedict V. Safourek
Attorney, Agent, or Firm—Pearne, Gordon, Session, McCoy, Granger & Tilberry

[57] ABSTRACT

An adaptive predicting circuit comprises a lattice filter with N identical cells each having four accesses. The first and second accesses of a cell are respectively connected to the third and fourth accesses of the preceding cell. Each cell comprises a circuit with a delay of one sampling time and two multipliers each having two inputs, one receiving a signal and the other a multiplication coefficient $k_m(t)$. The coefficient $k_m(t)$ is supplied to the multipliers. The adaptive predicting circuit also comprises an adder having N inputs respectively connected to the N cells and one output supplying a prediction signal. The coefficient $k_m(t)$ is supplied by a circuit for the sequential adaptation of the coefficient $k_m(t)$ inherent to each cell. The adaptation circuit has four inputs respectively connected to the first access of the cell, to the output of the delay circuit, and to the third and fourth accesses.

7 Claims, 9 Drawing Figures

PRIOR ART

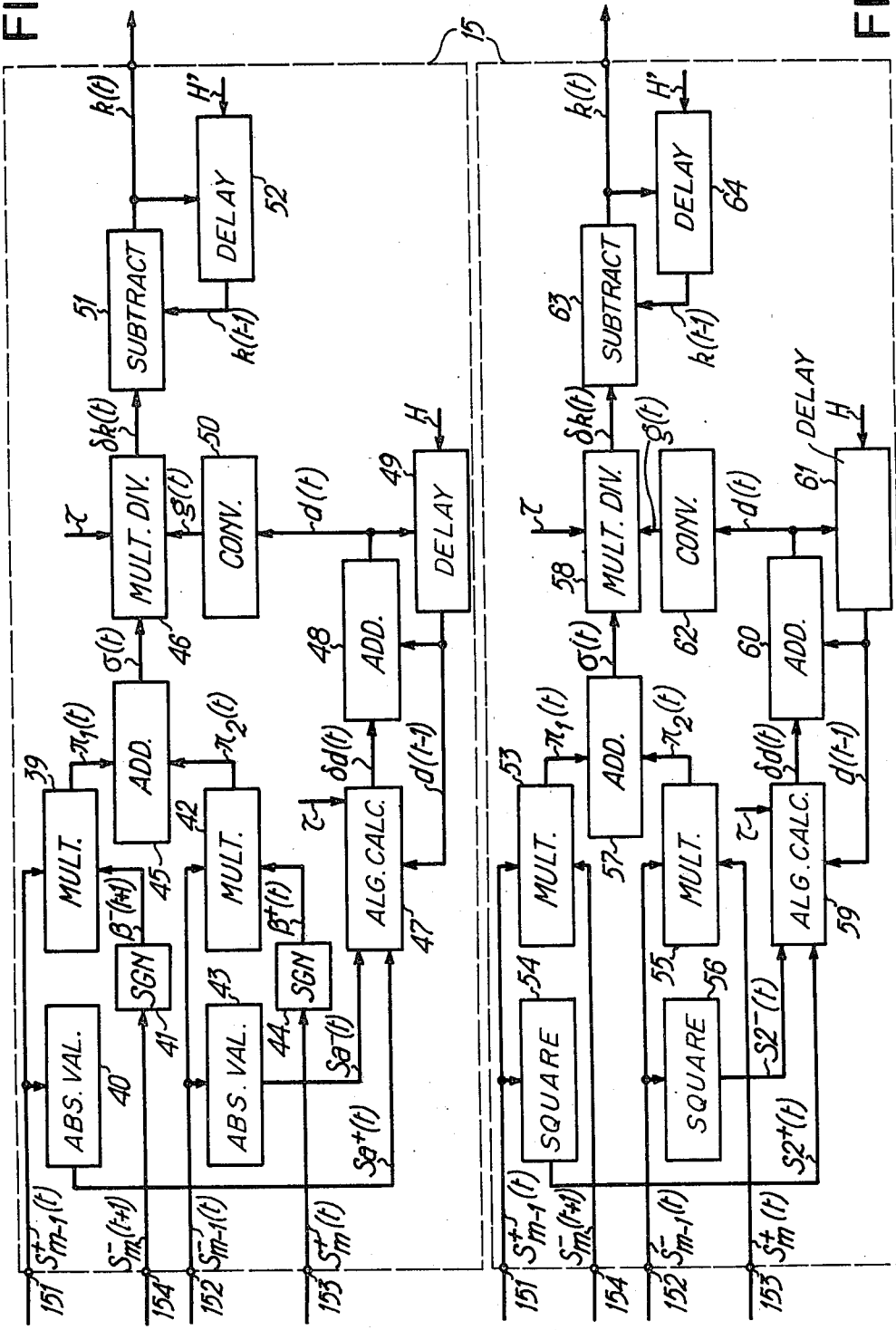

ADAPTIVE PREDICTING CIRCUIT USING A LATTICE FILTER AND A CORRESPONDING DIFFERENTIAL PCM CODING OR DECODING APPARATUS

BACKGROUND OF THE INVENTION

The present invention relates to an adaptive predicting circuit using a lattice filter and a corresponding differential PCM coding or decoding apparatus. It is intended for use in telecommunications, particularly in telephony.

The PCM (pulse code modulation) procedure is widely used in the field of telecommunications and particularly in telephone transmissions. According to this procedure on transmission the signal to be transmitted is sampled, the samples obtained quantized, the quantized signals are coded in digital form and the coded signals transmitted, whilst on reception the signals received are decoded and the original signal restored.

An improvement to this procedure is obtained if, instead of quantizing the input signal, the difference between this signal and a prediction signal obtained from the formation of said difference is quantized. The predicted signal is supplied by a predicting circuit or predictor, thus forming the differential PCM system.

Another improvement is obtained by multiplying the difference signal by a gain factor in order to bring about optimum use of the available levels of the quantizer. The quantized signal is then divided by the same factor to restore the original quantized sample.

In a differential PCM system the predicting circuit generally comprises a linear filter which, from a sequence of samples preceding the sample to be processed, is able to give a prediction in connection with the latter sample.

A predicting filter can be fixed once and for all and in this case its characteristics are chosen so that it is adapted to the mean, long-term spectrum of the signal to be transmitted. However, such a filter does not make it possible to obtain a very good transmission quality. The latter can be improved if the predicting filter is adapted to the developments of the signal in time, as a result of a periodic updating of its characteristics.

This adaptation can be carried out sequentially or recursively by correcting at each sampling time or instant the characteristics of the filter as a function of the value taken by the difference signal at this time. The adaptation criterion is that the mean power of the difference signal (which is to some extent an error signal) is as low as possible.

A large amount of research has already been carried out on this procedure called adaptive prediction differential PCM (or ADPCM for short), when applied to the telephone speech signal. The following articles survey the research and describe the procedures of differential PCM coding:

"Digital Coding of Speech Waveforms: PCM, DPCM, and DM quantizers" by N. S. JAYANT, published in the U.S. journal "Proceedings of IEEE," May 1974;

"Adaptive predictive coding of Speech signals" by B. S. ATAL and M. R. SCHROEDER, published in the U.S. journal "B.S.T.J.", vol. 49, October 1970;

"Speech Coding" by J. L. FLANAGAN, M. SCHROEDER, B. ATAL, R. CROCHIERE, N. S. JAYANT, J. M. TRIBOLET, published in the U.S. journal IEEE-COM 27, No. 4, April 1979.

Systems using these general principles are briefly described relative to FIGS. 1 and 2. The circuit of FIG. 1 is a coding circuit, whilst that of FIG. 2 is a decoding circuit.

The ADPCM coder of FIG. 1 comprises an algebraic subtractor 1 with two inputs, the first receiving the signal to be coded y(t) and the second a prediction signal $\bar{p}(t)$. The output of this subtractor supplies a difference or error signal e(t), which is applied to the input of an arithmetic unit 2, controlled by a signal $\bar{e}(t-1)$. The output of arithmetic unit 2 supplies a signal en(t), which is supplied to the input of a coding circuit 3, whose output supplies a coded signal c(t), which is applied on the one hand to a transmission channel and on the other to the input of a decoding-quantizing circuit 4. The latter supplies a signal $\bar{en}(t)$, which is applied to the input of an arithmetic unit 5, controlled by the signal $\bar{e}(t-1)$. The output of the latter unit supplies a signal $\bar{e}(t)$, which is a restored error signal, which is applied to a first input of an adaptive predicting circuit 8, to the first input of an algebraic adder 7 and finally to the input of a register 6 controlled in reading by pulses coming from a clock H. This register supplies a delayed signal $\bar{e}(t-1)$, which is applied to the control input of circuits 2 and 5. The output of the adaptive predicting circuit 8 supplies the signal $\bar{p}(t)$ applied on the one hand to the second input of subtracting circuit 1 and on the other to the second input of adding circuit 7, whose output supplies a restored signal $\bar{y}(t)$, which is applied to a second input of circuit 8.

In the illustrated embodiment the speech signal y(t) is assumed to be applied to the input in digital form, e.g. as a 12 bit linearized code supplied by the decompression of the standard PCM code (the PCM coder and linearizer are not shown).

The system of circuits 2, 3, 4, 5, 6 constitutes an embodiment of a conventional adaptive quantizer, circuits 2 and 5 having the respective function of standardizing to a fixed value the power of error signal e(t) and of restoring to the standardized quantized signal $\bar{en}(t)$ its real power in order to obtain the quantized error signal $\bar{e}(t)$.

The function of register 6 is to make available at the desired time the value of signal $\bar{e}(t-1)$ used in control.

The ADPCM decoder of FIG. 2 comprises a decoding-quantizing circuit 4, whose input receives the signal c(t) from the transmission channel and whose output supplies a signal $\bar{en}(t)$, which is applied to the input of an arithmetic unit 5 controlled by a signal $\bar{e}(t-1)$. The output of this unit supplies a signal $\bar{e}(t)$, which is applied to a first input of an adaptive predicting circuit 8, to a first input of an algebraic adder 7 and finally to the input of a register 6 controlled in reading by a clock H. The output of this register is connected to a control input of circuit 5. The output of the adaptive predicting circuit 8 supplies a predicting signal $\bar{p}(t)$, which is applied to a second input of algebraic adder 7, whose output supplies a signal $\bar{y}(t)$. This signal is applied to a second input of circuit 8 and it forms at the same time the output signal of the decoder, i.e. definitively the transmitted signal corresponding to y(t).

Circuits 4, 5, 6, 7, 8 of this decoder are identical to the circuits with the same reference numerals in FIG. 1.

The present invention relates solely to the predicting circuit 8 used in the coder or decoder, the other components being of a per se known type.

In the prior art said circuit is in the form of a transverse filter and is generally of the all-zero type, due to the fact that the corresponding transfer function only has zeros and no pole. Such a filter multiplies successive samples by coefficients, the latter being calculated by means of algorithms of the stochastic gradient type or by the KAIMAN method.

This type of predictor with a transverse filter has two disadvantages:

it makes it difficult to control the stability of the feedback loop formed in the coder (cf. FIG. 1), particularly when the number of coefficients exceeds 2;

it uses coefficients, whose orders of magnitude can be very dissimilar according to the nature of the coded signals, whilst fluctuations in the values of the coefficients produced by the adaptation are of the same order of magnitude for all coefficients, so that those which are low in absolute value are of little significance, whilst their precise knowledge would improve the modeling of the spectrum of the signal and would consequently improve the efficiency of the prediction.

The present invention relates to a means for improving the efficiency of predicting circuits and is directed at eliminating the stability control problem and reducing the inaccuracy of modeling. To this end the invention uses a special filter structure, called a lattice structure, with which are associated adequate means for the readjustment of coefficients.

The lattice filter is not novel per se. It comprises a circuit formed from a plurality of cells with four accesses arranged end to end, two accesses of one cell being joined to two accesses of the preceding cell. For application to prediction one signal is extracted from each of the cells and an adder summates the extracted signals to constitute the sought prediction signal.

In the lattice structure closest to that use in the invention each cell in particular comprises a delay circuit and two multipliers with two inputs, one receiving a signal and the other a multiplication coefficient, also called a partial correlation coefficient or a reflection coefficient. A lattice filter with N cells thus requires the formation of a system of N coefficients, said system being readjusted as a function of the input signal, which gives the apparatus its adaptive character.

With regards to the principle of the lattice filter and the reflection coefficient calculating means reference can be made to the following articles:

"Stable and efficient lattice methods for linear predictor" by J. MAKHOUL, published in U.S. journal IEEE, Transactions on Acoustics, Speech and Signal Processing, October 1977;

"Adaptive lattice methods for linear prediction" by J. MAKHOUL and R. VISWANATHAN, paper read to the Congress of the A.S.S.P. Group (Acoustics, Speech and Signal Processing) of the IEEE, Tulsa, 1978.

To provide a better understanding of the invention certain characteristics of lattice filters will now be described.

In a lattice structure two groups of signals $S_0^-(t)$, $S_1^-(t), \ldots, S_{N-1}^-(t)$ and $S_0^+(t), \ldots, S_{N-1}^+(t)$ are formed, which differ from the previously coded signals $y(t)$. The coefficients $k_1(t), k_2(t), \ldots, k_N(t)$ of the lattice filter are adjusted in such a way that the following formula is proved:

$$S_m^-(t) = \bar{y}(t-m-1) - E[\bar{y}(t-m-1)/\bar{y}(t-1), \ldots, \bar{y}(t-m)]$$

for $m = 1, \ldots, M$, and where $E[./.]$ designates an estimate in the sense of least squares and the oblique bar means "conditionally to the knowledge of". The signals $S_0^-(t), S_1^-(t), \ldots, S_{N-1}^-(t)$ are on the one hand decorrelated with respect to one another and on the other are adequate for reconstituting the signals $\bar{y}(t-1), \ldots, \bar{y}(t-N)$. It is stated that the lattice filter is an orthogonalizer in the sense that an orthogonal base is formed there of the previously observed signals.

The prediction $\bar{p}(t)$ is calculated by the formula:

$$p(t) = k_1(t) S_0^-(t) + k_2(t) S_1^-(t) + \ldots + k_N(t) S_{N-1}^-(t)$$

On the basis of the orthogonality principle the lattice filter formulas are applied:

$$S_m^-(t+1) = S_{m-1}^-(t) + k_m(t) S_{m-1}^+(t) \text{ for } m=1, \ldots, N \quad (1)$$

$$S_m^+(t) = S_{m-1}^-(t) + k_m(t) S_{m-1}^-(t), \text{ for } m=1, \ldots, N \quad (2)$$

$$S_{m-1}^+(t) = S_m^+(t) - k_m(t) S_{m-1}^-(t), \text{ for } m=1, \ldots, N \quad (3)$$

Formula (2) corresponds to the so-called analysis structure, because in the filter the progressive decorrelation or analysis of signal $\bar{y}(t)$ is carried out. Formula (3), which is merely Formula (2) reversed, corresponds to the so-called synthesis structure, because the progressive restoration or synthesis of the signal $\bar{y}(t)$ from signal $\bar{e}(t)$ takes place in the filter. The filter with the "analysis" structure is non-recursive (it only has zeros). The filter with the "synthesis" structure is purely recursive (it only has poles).

The coefficients $k_m(t)$, $m=1, N$ are dimensionless and have a value which is theoretically between $-1$ and $+1$. The zeros or poles of the filter then remain within the unity circle, which guarantees the stability of the coder loop in which the filter is positioned. Thus, in practice it is merely necessary to limit the absolute value of each coefficient by 1 to preserve this stability.

According to the selected optimization criterion there are several possibilities for calculating the coefficients $k_m(t)$. In a first an attempt is made to minimize the sum of the powers of signals $S_m^+(t)$ and $S_m^-(t+1)$; $k_m(t)$ then being calculated by the following formula:

$$k_m(t) = \frac{-2 <S_{m-1}^-(t) S_{m-1}^+(t)>}{<(S_{m-1}^+(t))^2 + (S_{m-1}^-(t))^2>}$$

$<\cdot>$ representing a statistical average. in practice the statistical average is replaced by a time average effected by a recursive estimate of the corresponding quantities. Thus, a conventional method is obtained for the adaptation of the coefficients and a use within the invention will be described hereinafter. A simplification of this method consists of estimating the correlation term $<S_{m-1}^-(t) S_{m-1}^+(t)>$ from the product of the signs of signals $S_{m-1}^-(t)$ and $S_{m-1}^+(t)$ by establishing a correspondence between the average of the product of the signs and the exact value of the correlation coefficient by forming a hypothesis on the statistical nature of the signals. In this connection reference can be made to the article entitled "Reflection coefficient estimates based on a Markov Chain model" published by B.

DICKINSON and J. TURNER in a paper to the Congress of the A.S.S.P. Group of the IEEE in 1979.

Another method according to the same criterion consists of transforming the formulas in such a way that the coefficients are calculated by an algorithm of the gradient of form:

$$k_m(t+1) = k_m(t) - \tau g(t)[S_{m-1}^-(t)S_m^+(t) + S_{m-1}^{+-}(t)S_m^-(t+1)]$$

in which $\tau$ is a constant and $g(t)$ a simultaneously adjusted gain like the inverse of a recursive estimate of the sum of the powers of signals $S_{m-1}^+(t)$ and $S_{m-1}^-(t)$ in such a way that the coefficient remains dimensionless. This method is called the product p r method.

According to another criterion an attempt is made to minimize the average of the sum of the absolute values of signals $S_m^+(t)$ and $S_m^-(t+1)$. A practical method for adapting the coefficients uses an algorithm of the gradient of form:

$$k_m(t+1) = k_m(t) - \tau g(t)[S_{m-1}^-(t).\text{sign } S_m^+(t) + S_{m-1}^+(t).\text{sign } S_m^-(t+1)]$$

the gain $g(t)$ being simultaneously adjusted like the inverse of a recursive estimate of the average of the sum of the absolute values of signals $S_{m-1}^+(t)$ and $S_{m-1}^-(t)$ in such a way that the coefficient remains dimensionless. This method is called the hybrid product method.

The use of these algorithms will be specifically described hereinafter.

All these coefficient adaptation methods, the list of which is naturally in no way exhaustive, have been experimentally tested by measurement and listening tests. They lead to comparable performances.

The lattice filter has already been used in ADPCM equipment, but under conditions differing from differing from those of the invention. Thus, in the prior art the coefficient evaluation means have been based on an analysis of sample blocks and readjustment takes place in a member outside the filter. The system of N coefficients is calculated in this member and is supplied to the filter at the end of each analysed block or in other words once per block. Thus, such a member is of a single, non-sequential nature and is outside the filter.

According to the present invention each cell of the filter comprises a specific circuit able to calculate the coefficient allocated to this cell. Moreover, the circuit functions on the basis of signals present in the cell. Therefore it is able to readjust the coefficient which it supplies at each sampling time and in proportion to the advancement of the signals in the filter. Finally this circuit is able to supply the coefficient as soon as it is available, i.e. at each sampling time and not only after a time lapse covering several samples. The means for readjusting the reflection coefficients are therefore, according to the invention, and unlike those in the prior art of a multiple and sequential nature whilst being positioned inside the filter.

BRIEF SUMMARY OF THE INVENTION

The present invention more specifically relates to an adaptive predicting circuit comprising:
(A) a lattice filter with N identical cells each having a first access, a second access, a third access and a fourth access, the first and second accesses of a cell of rank m being respectively connected to the third and fourth accesses of the preceding cells of rank m−1, each cell comprising a circuit with a delay of one sampling time connected to the second access and circuits of linear combinations of signals appearing at the accesses of the cell and more particularly two multipliers each having two inputs, one receiving a signal and the other a multiplication coefficient $k_m(t)$ dependent on the sampling time t, means being provided for supplying said coefficient $k_m(t)$ to the multipliers;
(B) an adder with N inputs respectively connected to N cells and with one output supplying a prediction signal;
wherein the means for supplying the said coefficient $k_m(t)$ comprise in each cell a circuit for the sequential adaptation of the coefficient $k_m(t)$ inherent to each cell, said circuit having a first input, a second input, a third input and a fourth input, said inputs being respectively connected to the first access of the cell, to the output of the delay circuit and the third and fourth accesses of the cell, said circuit also having an output which supplies the said coefficient $k_m(t)$, the N coefficients of the lattice filter thus being readjusted by these N adaptation circuits to each sampling time from signals present at this time in the filter and used immediately after readjustment.

According to the invention two specific embodiments are provided, one using a structure of the synthesis type and the other a structure of the analysis type.

The invention also relates to a differential PCM coding or decoding apparatus using the predictor defined hereinbefore.

BRIEF DESCRIPTION OF THE DRAWINGS

The invention is described in greater detail hereinafter relative to non-limitative embodiments and the attached drawings, wherein show:

FIG. 7 a block diagram of a circuit for the sequential adaptation of the coefficients of a lattice filter according to the gradient with hybrid product method according to the invention.

FIG. 8 a block diagram of a circuit for the sequential adaptation of coefficients of a lattice filter according to the pure product gradient method.

DETAILED DESCRIPTION OF THE PREFERRED EMBODIMENTS

The equipment described hereinbefore can be constructed either with circuits and analog or hybrid components (i.e. using both analog and digital signals) or by integrally digital circuits and components. In this case the number of significant bits (mantissa) can, for example, be 12 or 10 for the coefficients and 16 for the actual signals. Certain operations require the use of an exponent, which can be approximately $2^{10}$.

The understanding of the aforementioned block diagram involves the use of conventional logical conventions. The synchronization and sequencing of the operations require control signals and not shown registers, which are only shown if they are absolutely necessary for the understanding of the illustrated means. For example the sampling clock signal H must be correctly delayed where this is necessary.

The numbering in the form n/1, n/1, ..., n/N of a plurality of N circuits in the same diagram refers to identical circuits of general reference n and fulfilling the same function.

Figure 3:
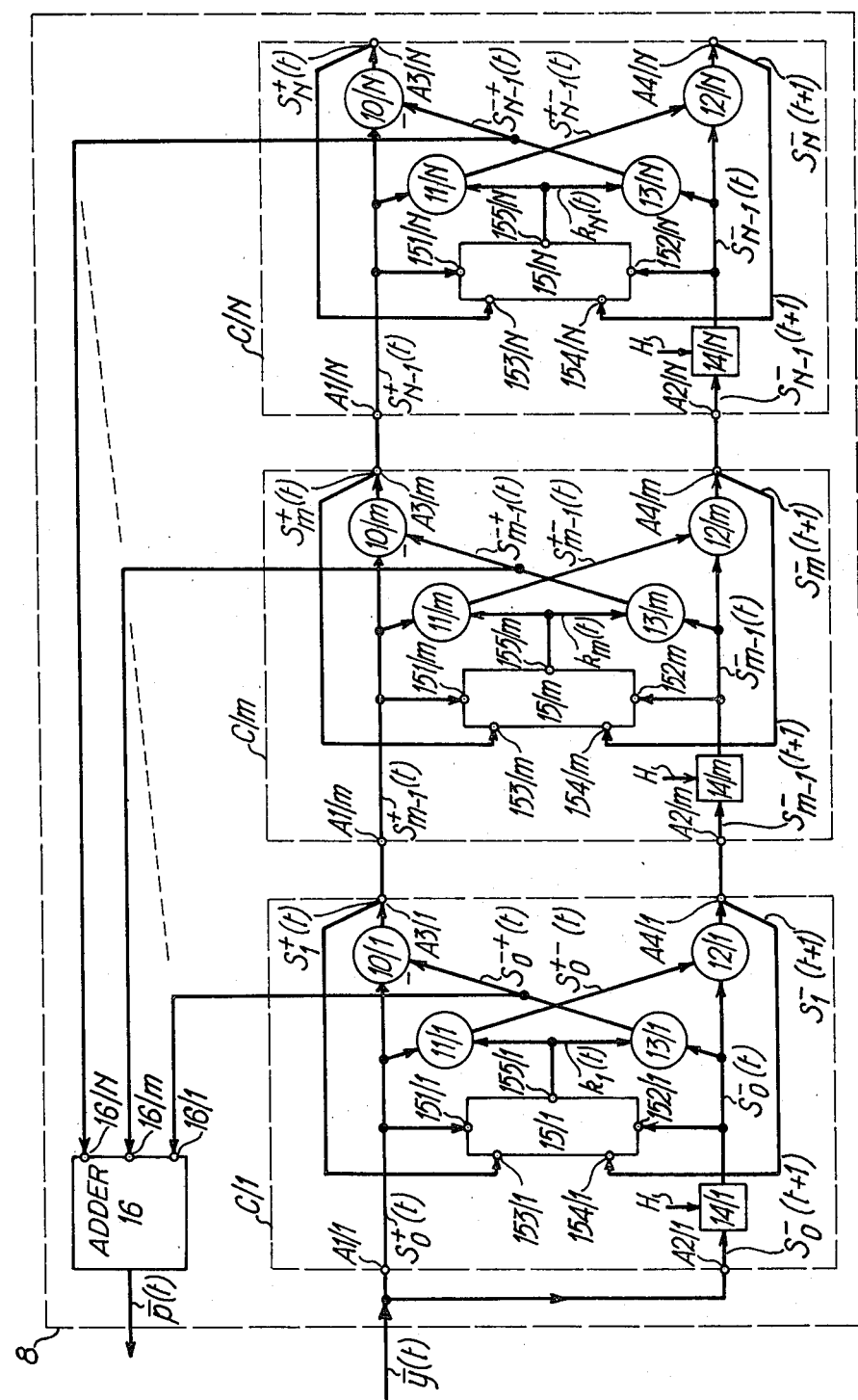
FIGS. 3 and 4 block diagrams respectively of two variants of the adaptive predicting circuit with a lattice filter according to the invention, the first using an analysis filter and the second a synthesis filter.
Figure 4:
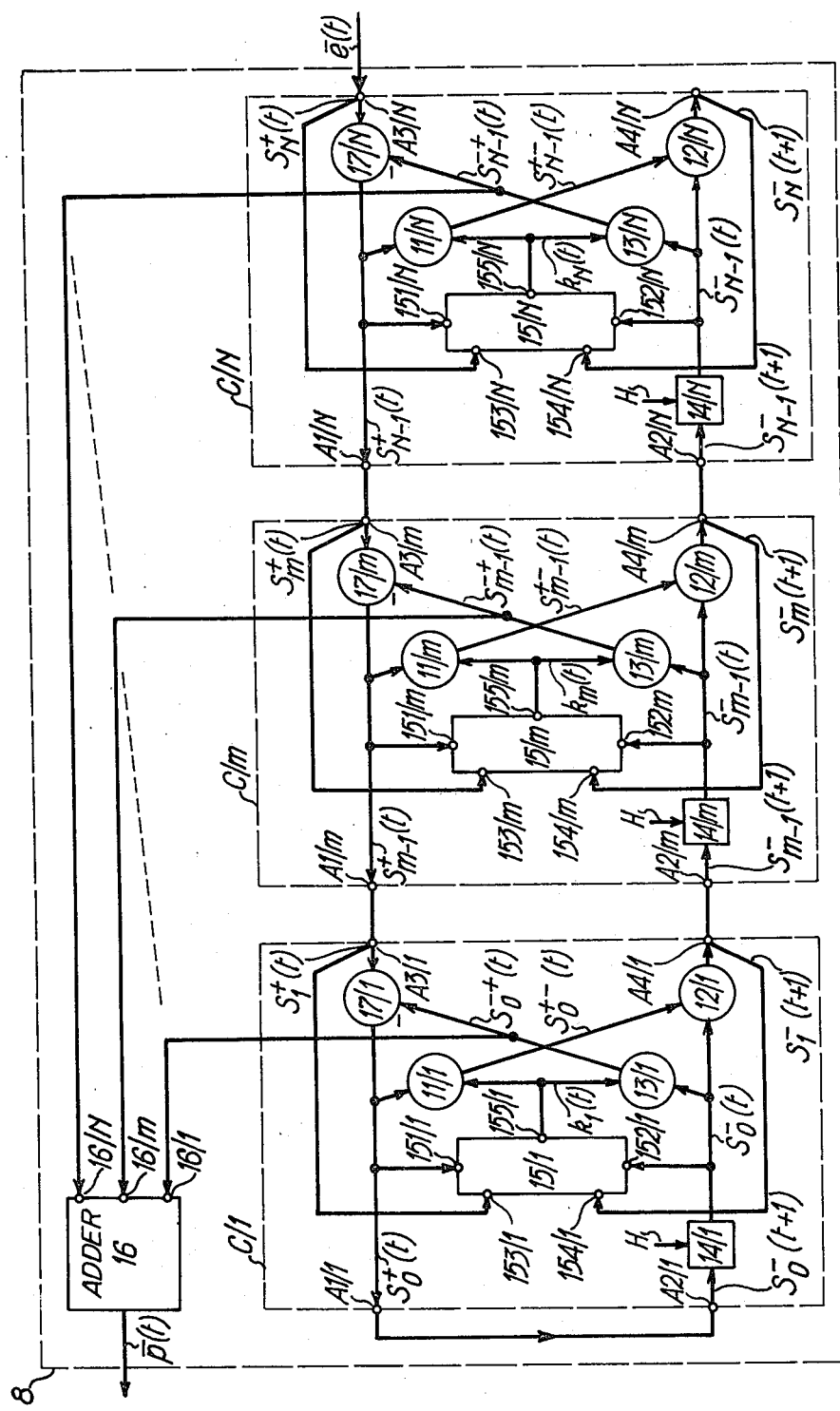

FIGS. 3 and 4 firstly represent the general structure of an adaptive predictor using a lattice filter according to the invention. This filter comprises N identical cells C/1, C/a, ..., C/m, ..., C/N. Thus, only the cell of rank m will be described, m being of a random nature between 1 and N. The numerical references given in FIGS. 3 and 4 carry an index (1, m, ..., N) which is that of the corresponding cell.

The components of the predicting filter shown and which are in accordance with the prior art are as follows:

Each cell has a first access $A_1/m$, a second access $A_2/m$, a third access $A_3/m$ and a fourth access $A_4/m$. The first and second accesses of the cell are respectively connected to the third and fourth accesses of the preceding cell.

In the case of the drawing each cell is constituted by:

(a) a first adder 10/m (in the case of FIG. 3) having an input connected to the first access $A_1/m$ of the cell, a second input and an output connected to the third access ($A_3/m$) of the cell, whereas in the case of FIG. 4 the first circuit is a subtracter 17/m having a first input connected to access $A_3/m$, a second input and an output connected to access $A_1/m$ of the cell;

(b) a first multiplier 11/m having a first input connected to the first access $A_1/m$ of the cell, a second input receiving a signal corresponding to the coefficient $k_m(t)$ and an output;

(c) a second adder 12/m having a first input connected to the output of the first multiplier, a second input and an output connected to the third access $A_3/m$ of the cell;

(d) a second multiplier 13/m having a first input, a second input receiving a signal corresponding to the said coefficient $k_m(t)$ and an output connected to the second input of the first adder 10/m (in the case of the variant of FIG. 3) or of the subtractor 17/m (in the case of the variant of FIG. 4);

(e) a delay circuit 14/m having an input connected to the second access $A_2/m$ of the cell and an output connected to the second input of the second adder 12/m and to the second input of the second multiplier 13/m.

Moreover, the predictor shown comprises in per se known manner an adder 16 with N inputs 16/1, ..., 16/N respectively connected to the outputs of the second multipliers 13/m of the cells and to an output supplying a prediction signal $\bar{p}(t)$.

The original element of the circuit shown is constituted by the presence in each cell of a circuit 15/m for the sequential adaptation of the coefficient $k_m(t)$ inherent to each cell. This circuit has a first input 151/m, a second input 152/m, a third input 153/m and a fourth input 154/m, said inputs being respectively connected to the first access $A_1/m$ of the cell, to the output of the delay circuit 14/m at the third and fourth accesses $A_3/m$, $A_4/m$ of the cell. This circuit has an output 155/m which supplies the said coefficient $k_m(t)$ and which is connected to the second input of the first multiplier 11/m and to the first input of the second multiplier 13/m.

As a result of the said N adjustment circuits, the N coefficients of the lattice filter can be readjusted at each sampling time on the basis of the signals which are present at this time in the filter. Immediately after readjustment these coefficients can be used in two multipliers 11/m and 13/m.

The difference between these two variants shown in FIGS. 3 and 4 is that the filter of FIG. 3 is of the analysis type, whilst that of FIG. 4 is of the synthesis type.

More specifically in the filter of FIG. 3 the first and second accesses $A_1/m$ and $A_2/m$ of each cell are inputs and the third and fourth access $A_3/m$ and $A_4/m$ are outputs. The input signal of the circuit is the restored signal $\bar{y}(t)$ and it is applied to the first two inputs $A_1/1$ and $A_2/1$ of the first cell $C_1$.

In the filter of FIG. 4 the first access $A_1/m$ of each cell is an output, the second $A_2/m$ an input, as is the third $A_3/m$, the fourth $A_4/m$ is an output. The first access $A_1/1$ of the first cell $C_1$ is connected to the second access $A_2/1$ of the same cell. The input signal is the restored error signal $\bar{e}(t)$, which is applied to the third access of the cell of rank N, which is an input of the filter.

These circuits function in the following manner.

In the circuit of FIG. 3 the signals applied to the two inputs $A_1/1$ and $A_2/1$ are respectively designated $S_0^+(t)$ and $S_0^-(t+1)$ in accordance with the expressions given hereinbefore. The signal $S_0^+(t)$ is applied to the first input of adding circuit 10/1, to the first input of multiplication circuit 11/1, as well as to the first input 151/1 of circuit 15/1 for the sequential adaptation of the coefficients of the filter. The signal $S_0^-(t+1)$ is applied to the input of the delay circuit 14/1 actuated in reading by the clock signal H. The output of circuit 13/1 supplies a signal $S_0^-(t)$ which is applied to the first input of adding circuit 12/1, to the first input of multiplication circuit 13/1, as well as to the second input 152/1 of circuit 15/1. The output of circuit 11/1 supplies a signal $S_0^{+-}(t)$, which is applied to the second input of circuit 12/1. The output of circuit 13/1 supplies a signal $S_0^{-+}(t)$, which is applied to the second input of circuit 10/1, as well as to the first input 16/1 of summating circuit 16. The output of circuit 10/1 supplies a signal $S_1^+(t)$, which is applied to the third input 153/1 of circuit 15/1. This output constitutes the output $A_3/1$ of the first cell. The output of circuit 12/1 supplies a signal $S_1^-(t+1)$, which is applied to the fourth input 154/1 of the circuit 15/1, said output also constitutes the second output $A_4/1$ of the first cell. The output 155/1 of circuit 15/1 supplies a signal $k_1(t)$, which is applied to the second input of circuit 11/1, as well as to the second input of circuit 13/1.

The same connections, with the corresponding indices, apply for the following cells of rank m > 1 up to the outputs including the circuits relating to the final cell of rank N, the outputs $A_3/m$, $A_4/m$ of the cell of rank m being connected to the inputs $A_1/m+1$ corresponding to the following cell of rank m+1. Finally the output of circuit 16, which is the output of circuit 8, supplies the prediction signal $\bar{p}(t)$.

The cells constituted by the circuits 10/m, 11/m, 12/m, 13/m, 15/m (but not the delay circuit 14/m) can be formed either from different circuits or from a single time-multiplexed cell, which is well adapted to the nature of the lattice filter, where the cells must function successively (the management of the multiplexing used in the latter case not being shown in the drawing).

Figure 1:
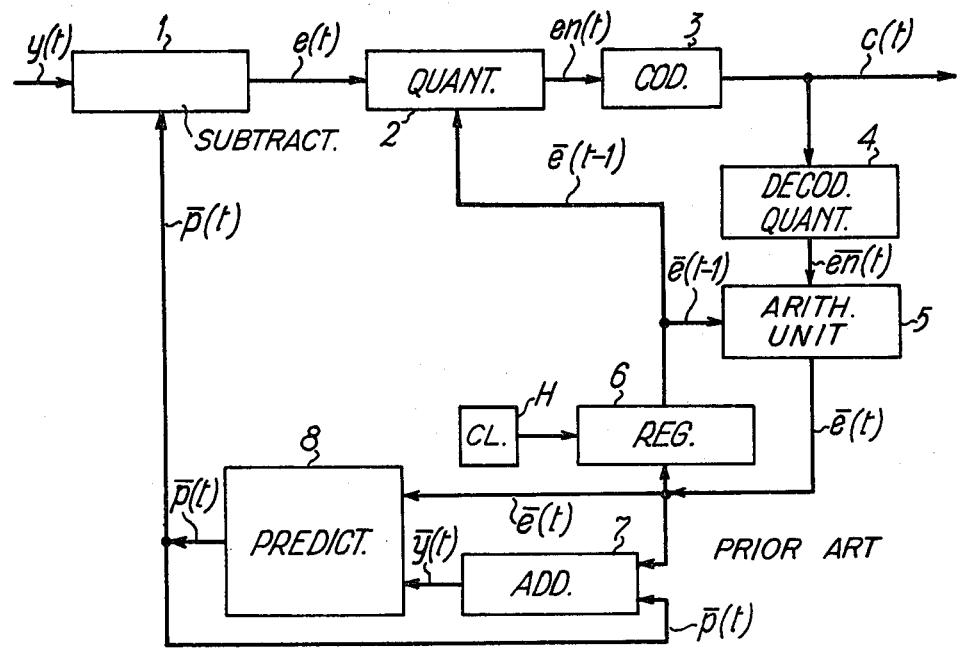
FIG. 1, a block diagram of an ADPCM coding circuit according to the prior art which can use the adaptive predicting circuit of this invention.

In the represented application the operation of the analysis-type lattice filter is introduced into the general operation of the differential coder of FIG. 1 (or decoder of FIG. 2) in the following way:

(1) before the current sampling time (i.e. at a time slightly preceding (t)) the products $S_m^{-+}(t)$ are calculated for $m=0, \ldots, N-1$, which can be stored in memory location registers (not shown) and $\bar{p}(t)$ has been calculated in circuit 16 which forms the sum:

$$\bar{p}(t) = -[S_0^{-+}(t) + \ldots + S_m^{-+}(t) + \ldots + S_{N-1}^{-+}(t)]$$

(2) at sampling time t in circuit 1 of the coder (cf. FIG. 1) the difference $e(t)=y(t)-\bar{p}(t)$ is formed, which is then quantized in circuit 2 which supplies $\bar{e}(t)$, said quantized difference being added in circuit 7 of the coder to the prediction $\bar{p}(t)$ to give the restored sample $\bar{y}(t)$, which is introduced into predictor 8 (similar operation is taking place in the decoder of the corresponding signals);

(3) then in circuit 10/1 is formed:

$$S_1^+(t) = S_0^+(t) + S_0^{-+}(t)$$

in circuit 11/1:

$$S_0^{+-}(t) = k_1(t)S_0^+(t),$$

and in circuit 12/1 is formed:

$$S_1^-(t+1) = S_0^-(t) + S_0^{+-}(t).$$

The circuit 15/1 can then operate to update the value of coefficient $k_1(t)$ which becomes $k_1(t+1)$, the same sequence of operations being carried out cell by cell up to the cell of rank N;

(4) clock H is actuated passing the output of delay circuits 14/m from $S_{m-1}^-(t)$ to $S_{m-1}^-(t+1)$ for $m = 1,2, \ldots, N$, the products $S_m^{-+}(t+1) = k_{m+1}(t+1)S_m^-(t+1)$ then being calculated, together with the prediction $\bar{p}(t+1)$, the system then being ready for the following sampling time $t+1$.

In an operating variant relating to stage 3 in the case where signals $S_1^+(t)$ and $S_1^-(t+1)$ are not explicitly used in current 15/1, the coefficient $k_1(t)$ is updated and becomes $k_1(t+1)$ as soon as signals $S_0^+(t)$ and $S_0^-(t)$ are available. Product $S_0^{+-}(t)$ is then calculated with its new coefficient, as well as a new value of the product $S_0^{-+}(t)$. The sums are then formed in the circuits 10/1 and 12/1. The same sequence of operations is carried out cell by cell up to cell N inclusive. Stages 1, 2 and 4 of the operation are unchanged.

In the variant of FIG. 4 the input signal of the lattice filter is a restored error signal $e(t)$. This signal is applied to the access $A_3/N$ of the final cell. Accesses $A_1/1$ and $A_2/1$ of the first cell are interconnected.

This circuit operates in the following manner. The input signal is designated $S_N^+(t)$, in accordance with the already used notations. This signal is applied to the first input of subtracting circuit 17/N, as well as to the third input of the circuit 15/N for the sequential adaptation of the filter coefficients. The second input of cell N carries a signal $S_{N-1}^-(t+1)$, which is applied to the input of delay circuit 14/N, controlled in reading by clock H. The output of circuit 14/N supplies a signal $S_{N-1}^-(t)$, which is applied to the first input of adding circuit 12/N, to the first input of multiplication circuit 13/N, as well as to the second input 152/N of circuit 15/N. The output of circuit 17/N supplies a signal $S_{N-1}^+(t)$, which is applied to the first input of multiplication circuit 11/N, as well as to the first input 151/N of circuit 15/N. It is also an output $A_1/N$ of the cell of rank N. The output of circuit 12/N supplies a signal $S_N^-(t+1)$, which is applied to the fourth input of circuit 154/N. It is also an output $A_4/N$ of cell N, which is not otherwise used. The output of circuit 11/N supplies a signal $S_{N-1}^{+-}(t)$, which is applied to the second input of circuit 12/N. The output of circuit 13/N supplies a signal $S_{N-1}^{-+}(t)$, which is applied to the second input (−) of circuit 17/N, as well as to the final input 16/N of summating circuit 16. Output 155/N of circuit 15/N supplies a signal $k_N(t)$, which is applied to the second input of circuit 11/N, as well as to the second input of circuit 13/N.

The same connections apply, with the corresponding indices, for all the cells of rank $m<N$ up to the cell of rank 1 inclusive. The comments made in connection with the description of FIG. 3 regarding the construction of the corresponding variant of circuit 8 apply here for the construction of each cell constituted by circuits 17/m, 11/m, 12/m, 13/m, and 15/m (except for delay circuit 14/m.

Figure 2:
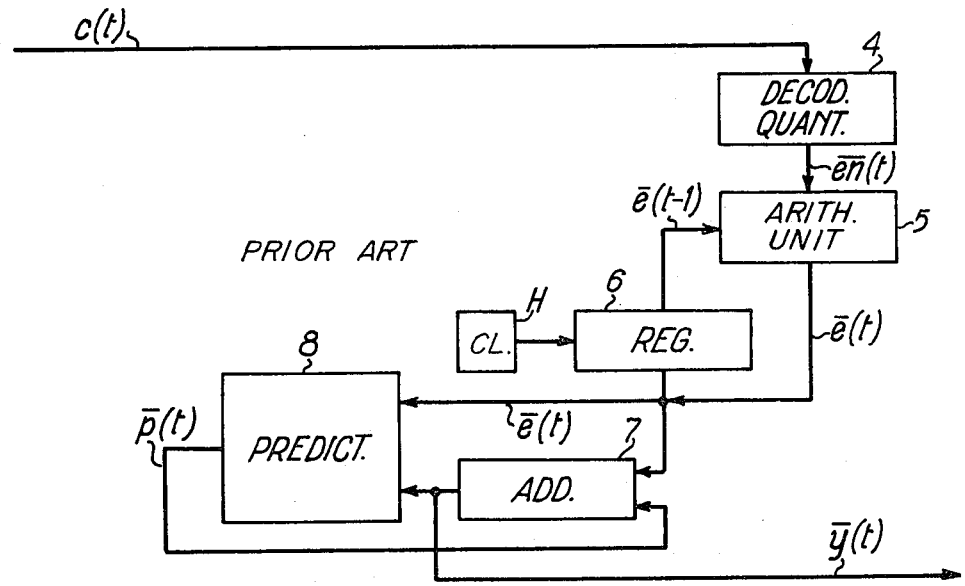
FIG. 2, a block diagram of an ADPCM decoding circuit according to the prior art which can use the adaptive predicting circuit of this invention.

The operation of the synthesis-type lattice filter is introduced into the general operation of the differential coder of FIG. 1 or decoder of FIG. 2 in the following way:

(1) before the current sampling time t the products $S_m^{-+}(t)$ are calculated as in the previous case and are stored in not shown memory location registers and $\bar{p}(t)$ has been calculated in the circuit 16 which forms the sum:

$$p(t) = -[S_0^{-+}(t) + S_1^{-+}(t) + \ldots + S_{N-1}^{-+}(t)]$$

(2) the quantized difference $e(t)$ obtained in the coder after the sampling time is introduced into predictor 8 (regarding the decoder the corresponding signal e is introduced into an identical predictor 8);

(3) in circuit 17/N is formed:

$$S_{N-1}^+(t) = \bar{e}(t) - S_{N-1}^{-+}(t)$$

in circuit 11/N is formed:

$$S_{N-1}^{+-}(t) = k_N(t)S_{N-1}^+(t)$$

and in circuit 12/N is formed:

$$S_N^-(t+1) = S_{N-1}^-(t) + S_{N-1}^{+-}(t)$$

circuit 15/N can then function to update the value of coefficient $k_N(t)$, which becomes $k_N(t+1)$, the same sequence of operations being carried out cell by cell up to the cell of rank 1 inclusive;

(4) clock H is actuated passing the output of delay circuits 14/m from $S_{m-1}^-(t)$ to $S_{m-1}^-(t+1)$ for m=1.2, ... N; the products $S_m^{-+}(t+1)$ then being calculated, together with the prediction $p(t+1)$, the system then being ready for the following sampling time $t+1$.

FIGS. 5 to 9 illustrate special embodiments of the circuits 15/1 and 15/N for the sequential adaptation of the coefficients of the lattice filter according to the invention. As the structures shown applied to any rank m, the latter has been omitted as an index in the numerical references used.

Figure 5:
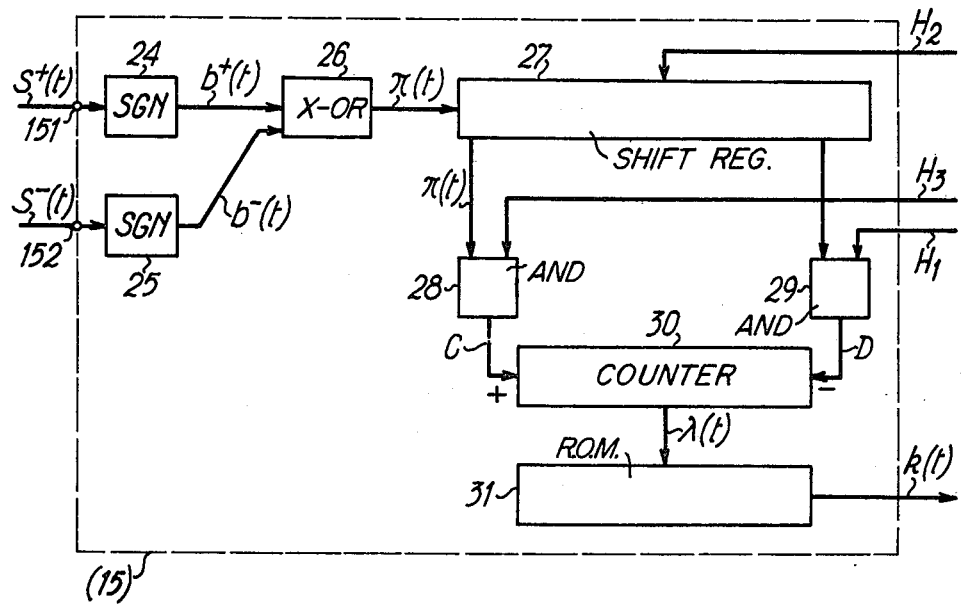
FIGS. 5 and 6 block diagrams of two variants of a circuit for the sequential adaptation of the coefficients of a lattice filter according to the so-called sign product method.

The circuit shown in FIG. 5 comprises:

a first sign detecting circuit 24 having an input connected to the first input 151 of the adapting circuit and an output, a second sign detecting circuit 25 having an input connected to the second input 152 of the adapting circuit and an output, an EXCLUSIVE-OR circuit 26 with two inputs respectively connected to the outputs of the first and second sign detecting circuits 24, 25 and with an output, a shift register 27 having a plurality of stages incorporating an input connected to the output of the EXCLUSIVE-OR gate with two outputs, the first corresponding to the first stage and the second to the last stage, a first AND gate 28 with two inputs, one receiving a clock pulse $H_3$ and the other connected to the first output of the shift register, and with an output, a second AND gate 29 with two inputs, one receiving a clock pulse $H_1$ and the other connected to the second output of the shift register and with one output, a bidirectional counter 30 with a forward count input connected to the output of the first AND gate 28 and a backward count input connected to the output of the second AND gate 29 and with an output, a read-only memory (ROM) 31 having an addressing input connected to the output of the bidirectional counter and an output supplying the sought coefficient $k(t)$.

This circuit uses the so-called sign product process and operates in the following way.

Inputs 153 and 154 of circuit 15 are not used. The signal $S_{m-1}^{+}(t)$ which is applied to one of the inputs of circuit 151 is designated by $S^{+}(t)$. The signal $S_{m-1}^{-}(t)$ which is applied to the other input of circuit 152 is designated $S^{-}(t)$.

Signal $S^{+}(t)$ is applied to the input of circuit 24 supplying at its output the sign of $S^{+}(t)$ in the form of a bit. The signal $S^{-}(t)$ is applied to the input of circuit 25, which is identical to circuit 24. The output of circuit 24 supplies a signal $b^{+}(t)$, which is applied to the first input of circuit 26, carrying out the logic EXCLUSIVE-OR function. The output of circuit 25 supplies a signal $b^{-}(t)$, which is applied to the second input of circuit 26. The output of this current supplies a signal $\pi(t)$, which is applied to the input of shift register 27, whose shift order of 1 step to the right is given by clock $H_2$. The output of the first stage of register 27 supplies signal $\pi(t)$, which is connected to the first input of the logic AND gate 28, whose second input receives clock $H_3$. The output of the final stage of register 27 supplies a signal $\pi(t-L+1)$ in which L is the number of stages of register 27. This output is connected to the first input of the logic AND gate 29, whose second input receives clock $H_1$. The output of circuit 28, designated C, is connected to the forward count input (+) of the binary bidirectional counter circuit 30. The output of circuit 29, designated D, is connected to the backward count input (−) of the same circuit 30. The output of the said circuit supplies a binary number $\lambda(t)$ between 0 and L, which is applied to the input of read-only memory 31.

In the illustrated embodiment the successive signals $\pi(t)$ from circuit 26 are stored in register 27 for a time equal to L sampling periods, after which they are lost. This time is of the order of magnitude of the time constant of the formation of the spectral characteristics of the word, i.e. approximately 10 ms. For a sampling period of 125 $\mu$s L=128 is taken as an example. During each sampling period clock $H_1$ is firstly actuated. If the bit $\pi(t-L)$ present in the final stage of 27 is at 1, the content of counter 30 is reduced by one unit. Clock $H_2$ is then actuated and brings about the shift by one step to the right of the content of register 27, whose first stage now contains bit $\pi(t)$. Finally clock $H_3$ is actuated. If the bit $\pi(t)$ is at 1, the content of counter 30 is increased by one unit. In this way the binary number stored in counter 30 exactly represents the number of non-coincidences of the signs of $S^{+}(t)$ and $S^{-}(t)$ observed in the current sampling period and during the preceding L-1 sampling periods. This binary number is then used as the address of a binary number representing an algebraic number between −1 and +1 introduced beforehand into the memory circuit 31 which serves as a table and whose output supplies the coefficient $k(t)$.

As an example the correspondence established between $\lambda(t)$ and $k(t)$ circuit 31 can be:

$$k(t) = -\sin\left(1 - \frac{2\lambda(t)}{L}\right)$$

Figure 6:
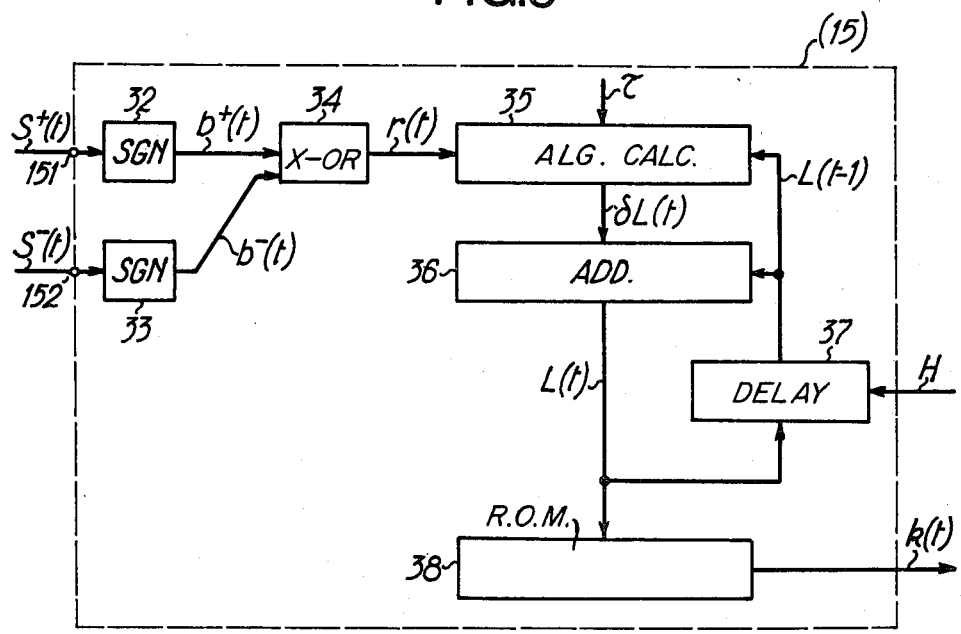
Figure 9:
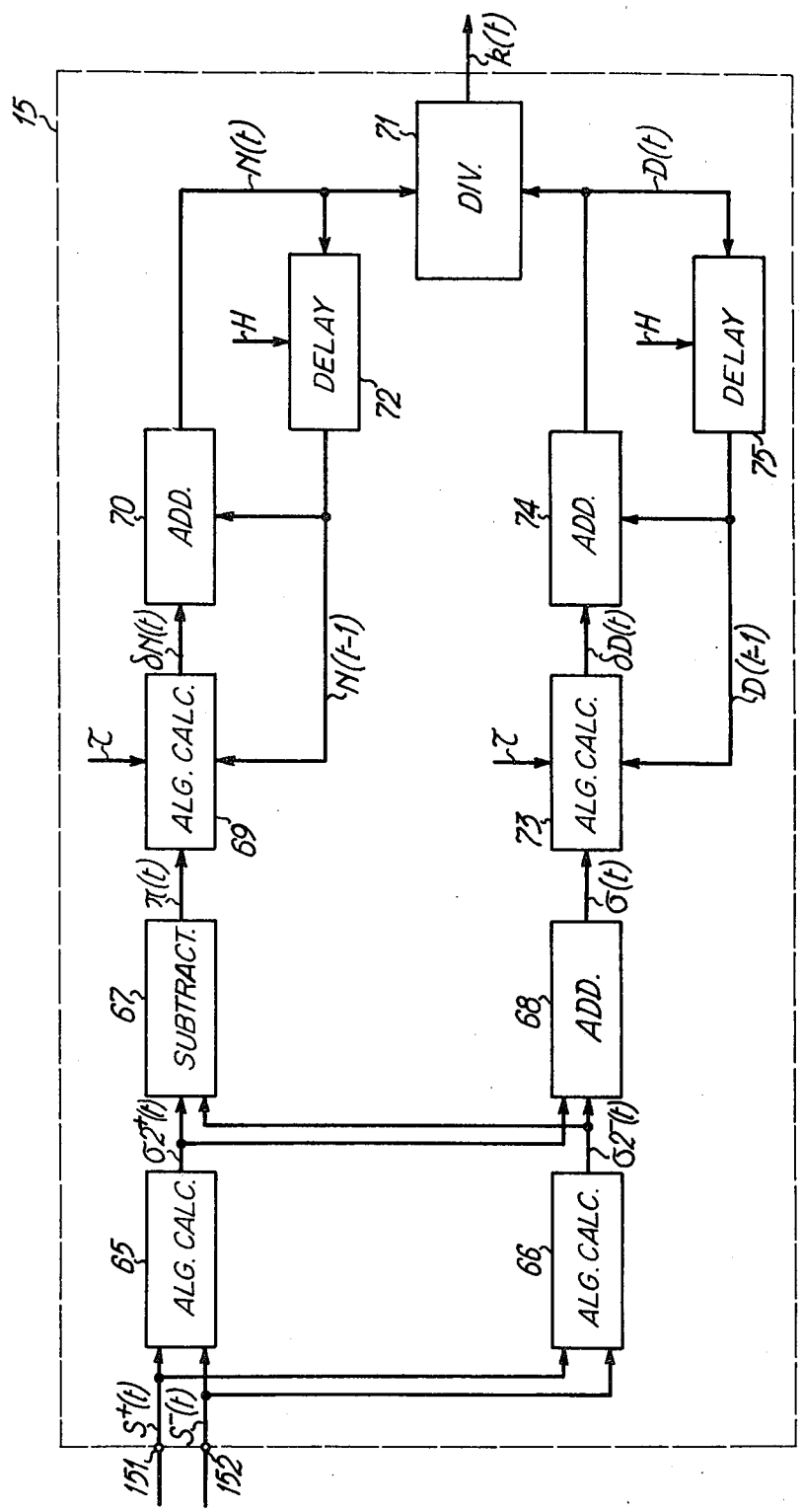
FIG. 9 a diagram of a circuit for the sequential adaptation of a coefficient of the lattice filter according to a conventional method.

FIG. 6 shows another embodiment of the coefficient readjustment circuit, which comprises:

a first sign detecting circuit 32 having an input connected to the first input 151 of the adaptation circuit and an output, a second sign detecting circuit 33 having an input connected to the second input 152 of the adapting circuit and an output, an EXCLUSIVE-OR circuit 34 with two inputs respectively connected to the outputs of the first and second sign detecting circuits 24 and 25 and with an output, an algebraic calculation circuit 35 having a first input connected to the output of the EXCLUSIVE-OR gate, a second input and an output, an adder 36 having a first and second inputs, the first being connected to the output of the algebraic calculation circuit, and an output, a delay circuit 37 having an input connected to the output of the adder and an output connected to the second inputs of the algebraic calculation circuit and the adder, a read-only memory 38 with one input connected to the adder output and with an output supplying the coefficient $k(t)$.

As in the previous variant this circuit uses the so-called sign product method. It operates in the following way. Inputs 152 and 154 are not always used. The signal $S_{m-1}^{+}(t)$ which is applied to input 154 of the circuit is designated $S^{+}(t)$ and is applied to circuit 32, which is identical to circuit 24 of FIG. 5. The signal $S_{m-1}^{-}(t)$ which is applied to the other input of the circuit is designated $S^{-}(t)$ and is applied to the input of circuit 33, which is identical to circuit 25. The output of circuit 32 supplies a signal $b^{+}(t)$, which is applied to the first input of circuit 34 realizing the logic EXCLUSIVE-OR function and the symmetrization function. The output of circuit 33 supplies a signal b⁻(t), which is applied to the second input of circuit 34. The output of this circuit supplies a signal r(t), which is applied to the second input of the algebraic calculation circuit 35, whose first input receives a constant signal τ and whose third input receives a signal L(t−1) from the output of delay circuit 37 actuated by clock H. The output of circuit 35 supplies a signal L(t) which is applied to the first input of adding circuit 36, whose second input receives signal L(t−1). The output of circuit 36 supplies a signal L(t), which is applied to the input of circuit 37, as well as to the input of the ROM 38, which supplies the coefficient k(t).

In the illustrated embodiment the bit resulting from the EXCLUSIVE-OR function applied to b⁺(t) and b⁻(t) is transformed by symmetrization into a binary number representing the values +1 or −1, depending on whether the said bit is equal to 0 or 1. The circuit carries out the calculation:

$$dL(t) = \tau[r(t) - L(t-1)]$$

so that signal L(t) is a recursive estimator with an exponentially decreasing memory (low pass filtering of the first order) of the intercorrelation between the signs of signals S⁺(t) and S⁻(t). The constant τ can be chosen equal to $2^{-k}$ in which k is a positive integer. The multiplication by τ corresponds in that case to a simple binary shift. Memory 38, which fulfils the function of a table, effects the non-linear correspondence between L(t) and k(t) e.g. of form:

$$k(t) = -\sin \frac{\pi}{2} L(t)$$

In a practical embodiment $\tau = 2^{-6}$ is taken as an example.

FIG. 7 illustrates another embodiment of a circuit for the sequential adaptation of a coefficient and which comprises:

a first multiplier 39 having a first input connected to the first input 151 of the adaptation circuit, a second input and an output, a first circuit 40 for giving an absolute value having one input also connected to the first input 151 and with one output, a first sign extraction circuit 41 with one input connected to the fourth input 154 of the adaptation circuit and with one output connected to the second input of the first multiplier 39, a second multiplier 42 having a first input connected to the second input of the adaptation circuit, a second input and an output, a second circuit 43 for bringing into absolute value with an input also connected to the said second input and with an output, a second sign extraction circuit 44 having an input connected to the third input 153 of the adaptation circuit and an output connected to the second input of the second multiplier 42, a first adder 45 with two inputs connected respectively to the outputs of the first and second multipliers 39, 42 and with an output, a multiplier-divider 46 with three inputs, the first receiving a constant signal, the second connected to the output of the first adder and a third input, an algebraic calculation circuit 47 with four inputs, a first receiving a continuous signal, a second connected to the output of the first circuit 40 for bringing into absolute value, a third connected to the output of the second circuit 43 for bringing into absolute value and a fourth input and with an output, a second adder 48 having a first input connected to the output of the algebraic calculation circuit, a second input and an output, a delay circuit 49 having an input connected to the output of the second adder 48 and an output connected to the second input of the second adder and to the fourth input of the algebraic calculation circuit, a conversion circuit 50 with one input connected to the output of the second adder 48 and with an output connected to the third input of the multiplier-divider 46, a subtracter 51 having a first input connected to the output of the multiplier-divider 46, a second input and an output supplying the coefficient k(t), a delay circuit 52 with an input connected to the output of subtracter 51 and with an output connected to the second input of said subtracter.

The represented circuit uses an original process with a hybrid product, its operation being as follows. The input 151 of the circuit receives a signal $S_{m-1}^+(t)$, which is applied to the multiplication circuit 39, as well as to the input of the circuit 40 for bringing into absolute value. Another input 154 of the circuit receives a signal $S_m^-(t+1)$, which is applied to the input of the sign extraction circuit 41. The output of circuit 41 supplies a signal $\beta^-(t+1)$, which is applied to the second input of circuit 39. The input 152 of the circuit receives a signal $S_{m-1}^-(t)$ which is applied to the multiplication circuit 42, as well as to the circuit 43 for bringing into absolute value. The input 153 of the circuit receives a signal $S_m^+(t)$, which is applied to the input of the sign extraction circuit 44. The output of this circuit supplies a signal $\beta^+(t)$, which is applied to the second input of circuit 42. Circuits 39 and 42, 40 and 43, 41 and 44 are respectively identical in pairs. The output of circuit 39 supplies a signal $\pi_1(t)$ applied to the The output of circuit 39 supplies a signal $\pi_1(t)$ applied to the first input of adding circuit 45. The output of circuit 42 supplies a signal $\pi_2(t)$ applied to the second input of circuit 45. The output of circuit 45 supplies a signal $\sigma(t)$ applied to the second input of the multiplier-divider circuit 46. The output of circuit 40 supplies a signal Sa⁺(t) applied to the third input of the algebraic calculation circuit 47. The output of circuit 43 supplies a signal Sa⁻(t) applied to the second input of circuit 47. The first input of this circuit receives a constant signal τ. The output of circuit 47 supplies a signal δd(t), which is applied to the first input of adding circuit 48. The output of circuit 48 supplies a signal d(t), which is applied to the input of delay circuit 49, as well as to the input of conversion circuit 50. Circuit 49, actuated in reading by the clock, supplies a signal d(t−1), which is applied to the fourth input of circuit 47, as well as to the second input of circuit 48. The output of circuit 50 supplies a signal g(t) applied to the third input of circuit 46, whose first input receives constant signal τ. The output of circuit 46 supplies a signal δk(t) applied to the first input of subtracting circuit 51, whose output supplies coefficient k(t), which is also applied to the input of delay circuit 52 controlled in reading by clock H′. The output of circuit 52 supplies the delayed coefficient k(t−1), which is applied to the second input of circuit 51.

In the illustrated embodiment the signal δ(t) present at the output of circuit 45 equals:

$$\delta(t) = S_{m-1}^+(t) \cdot \text{sign}[S_m^-(t+1)] + S_{m-1}^-(t) \cdot \text{sign}[S_m^+(t)].$$

This signal is processed by circuit 46 in such a way that the output signal of this circuit equals:

$$\delta k(t) = \tau \sigma(t)/g(t)$$

In the same way the output signal of circuit 47 equals:

$$\delta d(t) = \tau [|S_{m-1}^+(t)| + |S_{m-1}^-(t)| - d(t-1)]$$

so that d(t) is a recursive estimator with an exponentially decreasing memory of the mean value of the sum of the absolute values of signals $S_{m-1}^+(t)$ and $S_{m-1}^-(t)$. In circuit 51 signal δk(t) is reduced to k(t−1). Bearing in mind the form of δ(t) the coefficient k(t) is adjusted by an algorithm of the variable gain gradient with for the criterion the minimization of the expectation of the sum of the absolute values of signals $S_m^-(t+1)$ and $S_m^+(t)$.

In a variant given for information purposes circuit 50 carries out the conversion of signal d(t) into a signal g(t) equal to the power of 2 closest to the value of d(t). Thus, the division in circuit 46 is reduced to a logic shift. In another variant circuit 50 directly permits the passage of signal d(t) in such a way that g(t)=d(t), so that then a true division must be carried out in 46.

In another variant circuit 50 constitutes an ROM in which are tabulated the valuees of 1/g(t), designated $g^{-1}(t)$ in order to replace the division in circuit 46 by a multiplication, circuit 46 then carrying out the calculation:

$$\delta k(t) = \tau \sigma(t) \cdot g^{-1}(t)$$

8 to 10 bits being sufficient to define the tabulated values $g^{-1}(t)$.

The constant τ can be chosen equal to a negative power of 2, e.g. $2^{-6}$ in order to simplify the arithmetic operations in circuits 46 and 47.

FIG. 8 illustrates another embodiment of a circuit for the sequential adaptation of a coefficient and which comprises:

a first multiplier 53 having a first input connected to the first input 151 of the adaptation circuit, a second input connected to the fourth input 154 of this circuit and an output, a first circuit 54 for raising to the square, a second input also connected to the first input 151 and with an output, a second multiplier 55 having a first input connected to the second input 152 of the circuit, a second input connected to the third input 153 and an output, a second circuit 56 for raising to the square with one input also connected to the second input 152 and with an output, a first adder 57 with two inputs respectively connected to the outputs of the first and second multipliers 53, 55 and with an output, a multiplier-divider 58 with three inputs, a first receiving a constant signal, a second connected to the output of the first adder and a third input and with an output, an algebraic calculation circuit 59 with four inputs, a first receiving a continuous signal, a second connected to the output of the first circuit 54 for raising to the square, a third connected to the output of the second circuit 56 for raising to the square and a fourth input, and with an output, a second adder 60 having a first input connected to the output of the algebraic calculation circuit, a second input and an output, a delay circuit 61 having an input connected to the output of the second adder 60 and an output connected to the second input of said adder and to the fourth input of the algebraic calculation circuit 59, a conversion circuit 62 with an input connected to the output of the second adder 60 and with an output connected to the third input of the multiplier-divider 58, a subtracter 63 having a first input connected to the output of multiplier-divider 58, a second input and an output supplying the coefficient k(t), a delay circuit 64 with an input connected to the output of subtracter 63 and with an output connected to the second input of said subtracter.

The operation of this circuit, which is based on the method of the pure product gradient, is as follows.

The input 151 of the circuit receives a signal $S_{m-1}^+(t)$, which is applied to an input of the multiplication circuit 53, as well as to the input of circuit 54 for raising to the square. A second input of circuit 154 receives a signal $S_m^-(t+1)$ which is applied to the second input of circuit 53. Another input 152 of the circuit receives a signal $S_{m-1}^+(t)$, which is applied to an input of multiplication circuit 55, as well as to the input of circuit 56 for raising to the square. Another input 153 of the circuit receives a signal $S_m^+(t)$ applied to the second input of multiplication circuit 55. The output of circuit 53 supplies a signal $\pi_2(t)$ applied to the first input of adding circuit 57. The output of circuit 55 supplies a signal $\pi_2(t)$ applied to the second input of circuit 57. The output of circuit 57 supplies a signal σ(t) applied to the second input of the multiplier-divider circuit 58. The output of circuit 54 supplies a signal $S_2^+(t)$ applied to the third input of the algebraic calculation circuit 59. The output of circuit 56 supplies a signal $S_2^-(t)$ applied to the second input of circuit 59. The first input of said circuit receives a constant signal τ. The output of circuit 59 supplies a signal δd(t), which is applied to the first input of adding circuit 60. The output of this circuit supplies a signal d(t), which is applied to the input of delay circuit 61, as well as to the input of conversion circuit 62. The delayed output signal d(t−1) from circuit 61 actuated in reading by clock H is applied to the fourth input of circuit 59, as well as to the second input of circuit 60. The output of circuit 62 supplies a signal g(t) applied to the third input of circuit 58, whereof the first input receives the constant signal τ. The output of circuit 58 supplies a signal δk(t) applied to the first input of adding circuit 63, whose output supplies the coefficient k(t) applied in addition to the input of delay circuit 64, actuated in reading by a clock H'. The output of circuit 64 supplies a coefficient k(t−1) applied to the second input of circuit 63.

In the illustrated embodiment the signal σ(t) from circuit 57 equals:

$$\sigma(t) = S_{m-1}^+(t) \cdot S_m^-(t+1) + S_{m-1}^-(t) \cdot S_m^+(t)$$

and it is processed by circuit 58 in such a way that the output of this circuit supplies a signal:

$$\delta k(t) = \tau \sigma(t)/g(t).$$

In the same way the output signal of circuit 59 equals:

$$\tau[(S_{m-1}{}^+(t))^2+(S_{m-1}{}^-(t))^2-d(t-1)]$$

so that d(t) is a recursive estimator with an exponentially decreasing memory of the sum of the powers of signals $S_{m-1}{}^+(t)$ and $S_{m-1}{}^-(t)$. In circuit 63 signal $\delta k(t)$ is reduced to $k(t-1)$. Bearing in mind the form of $\sigma(t)$ this means that the coefficient k(t) is adjusted by an algorithm of the variable gain gradient with for the criterion the minimization of the sum of the powers of signals $S_m{}^-(t+1)$ and $S_m{}^+(t)$.

What has been stated hereinbefore in connection with the variants of circuit 50 in the previous drawing applies here for circuit 62, as does the comment on the form of constant $\tau$.

The circuit shown in FIG. 4 uses a conventional method and comprises:

a first algebraic calculation circuit 65 with two inputs, connected to accesses 151 and 152 of the cell in question and with one output, a second algebraic calculation circuit 66 with two inputs connected to the same accesses 151 and 152 and with an output, a subtracter 67 with two inputs, the first connected to the output of circuit 65 and the second to the output of circuit 66, an adder 68 with two inputs, the first connected to the output of circuit 65 and the second to the output of circuit 66, a first algebraic calculation circuit 69 with three inputs, the first receiving a constant signal $\tau$ and the second connected to the output of subtracter 67, a second algebraic calculation circuit 73 with three inputs, the first receiving the constant signal $\tau$ and the second connected to the output of adder 68, a first adder 70 with two inputs, one connected to the output of circuit 69, a delay circuit 72 having an input connected to the output of adder 70 and with an input connected to the third input of the same adder and to the third input of circuit 69, a second adder 74 with two inputs, whereof the first is connected to the output of circuit 73, a second delay circuit 75 having an input connected to the output of adder 74 and an output connected to the second input of the same adder, as well as to the third input of circuit 73, finally a sign change divider 71 with two inputs connected to the outputs of adders 70 and 74 and whose output supplies the coefficient k(t). This circuit operates in the following manner.

Input 151 receives a signal $S_{m-1}{}^+(t)$ designated here in the simplified form $S^+(t)$. This signal is applied to the first input of the algebraic calculation circuit 65, as well as to the first input of algebraic calculation circuit 66. Input 152 receives a signal $S_{m-1}{}^-(t)$, designated here in simplified form $S^-(t)$, which is applied to the second input of circuit 65, as well as to the second input of circuit 66. The output of circuit 65 supplies a signal $\sigma 2^+(t)$ applied to the first input of subtracting circuit 67, as well as to the first input of adding circuit 68. The output of circuit 66 supplies a signal $\pi(t)$ applied to the second input of circuit 67, as well as to the second input of circuit 68. The output of circuit 68 supplies a signal $\pi(t)$ applied to the second input of the algebraic calculation circuit 69, whose first input receives a constant signal $\tau$. The output of circuit 69 supplies a signal $\delta N(t)$ applied to the first input of adding circuit 70, whose output supplies a signal N(t) applied to the first input of sign change dividing circuit 71, as well as to the input of delay circuit 72 actuated in reading by clock H. The output of circuit 72 supplies a signal $N(t-1)$, which is applied to the third input of circuit 69, as well as to the second input of circuit 70. The output of circuit 69 supplies a signal $\sigma(t)$ applied to the second input of the algebraic calculation circuit 73, whose first input receives a constant signal $\tau$. The output of circuit 73 supplies a signal $\delta D(t)$ applied to the first input of adding circuit 74, whose output supplies a signal D(t) applied to the second input of circuit 71, as well as to the input of delay circuit 75 actuated in reading by clock H. The output of circuit 75 supplies a signal $D(t-1)$ applied to the third input of circuit 73, as well as to the second input of circuit 74. The output of circuit 71 supplies the sought coefficient k(t).

In the illustrated embodiment the circuit 65 carries out the calculation:

$$\sigma 2^+(t)=[S^+(t)+S^-(t)]^2$$

circuit 66 the calculation:

$$\sigma 2^-(t)=[S^+(t)-S^-(t)]^2$$

and consequently $\pi(t)=4S^+(t)S^-(t)$, and $$\sigma(t)=2[(S^+(t))^2+(S^-(t))^2]$$

Circuit 69 carries out the calculation:

$$\delta N(t)=\tau[\pi(t)-N(t-1)]$$

so that signal N(t) is a recursive estimator with exponentially decreasing memory of four times the intercorrelation of signals $S^+(t)$ and $S^-(t)$.

In the same way circuit 73 carries out the calculation:

$$\delta D(t)=\tau[\sigma(t)-D(t-1)]$$

so that signal D(t) is a recursive estimator of twice the sum of the respective powers of signals $S^+(t)$ and $S^-(t)$. Therefore k(t)=N(t)/D(t) is a recursive estimator of the theoretical coefficients of the lattice filter.

In order to simplify the calculations constant $\tau$ can be taken as equal to a negative power of 2.

In a variant the signal D(t) is the input of a read-only memory serving as a table where it is possible to read the value $D^{-1}(t)$ from its inverse, the circuit 71 then carrying out the multiplication $k(t)=-N(t)\cdot D^{-1}(t)$.

What is claimed is:

1. An adaptive predicting circuit comprising:
(A) a lattice filter with N identical cells (C) each having a first access port ($A_1$), a second access port ($A_2$), a third access port ($A_3$) and a fourth access port ($A_4$), the first and second access ports ($A_1/m$, $A_2/m$) of a cell (C/m) of rank m being respectively connected to the third and fourth access ports ($A_3/m-1$, $A_4/m-1$) of the preceding cell (C/m−1) of rank m−1, each cell comprising a circuit (14/m) for delaying sampling time connected to the second access port and circuits of linear combinations of signals appearing at the access ports of the cell, including first and second multipliers each having first and second inputs, one of said inputs receiving one of the signals and the other of said inputs receiving a multiplication coefficient $k_m(t)$ dependent on the sampling time t, means being provided for supplying said coefficient $k_m(t)$ to the multipliers; and (B) an adder (16) having N inputs respectively connected to the N cells and an output supplying a prediction signal;

wherein the means for supplying the coefficient $k_m(t)$ comprise in each cell a circuit (15/m) for the sequential adaptation of the coefficient $k_m(t)$ inherent to each cell, said adaptation circuit having a first input (151/m), a second input (152/m), a third input (153/m), and a fourth input (154/m), said inputs being respectively connected to the first access port ($A_1$/m) of the cell, to the output of the delay circuit (14/m) and to the third and fourth access ports ($A_3$/m, $A_4$/m) of the cell, said adaptation circuit also having an output (155/m) which supplies the coefficient $k_m(t)$, the N coefficients of the lattice filter being readjusted by the N adaptation circuits for each sampling time from the signals present at this time in the filter, and the coefficients being used immediately after readjustment.

2. An apparatus according to claim 1, wherein the lattice filter is of the analysis type, the first and second access ports ($A_1$/m, $A_2$/m) of each cell being inputs and the third and fourth access ports ($A_3$/m, $A_4$/m) being outputs, the input signal of the filter being applied to the first two access ports ($A_1$/1, $A_2$/1) of the first cell (C/1), each cell comprising:

(a) a first adder (10/m) having a first input connected to the input ($A_1$/m) of the cell, a second input, and an output connected to the output ($A_3$/m) of the cell;

(b) the first multiplier (11/m) having the first input connected to the input ($A_1$/m) of the cell, and the second input connected to the output of the adaptation circuit (15/m) and receiving the coefficient $k_m(t)$, and having an output;

(c) a second adder (12/m) having a first input connected to the output of the first multiplier, a second input connected to the output of the delay circuit (14/m), and an output connected to the output ($A_4$/m) of the cell;

(d) the second multiplier (13/m) having the first input connected to the output of the delay circuit (14/m), and the second input connected to the output of the adaptation circuit (15/m) and receiving the coefficient $k_m(t)$, and having an output connected to the second input of the first adder and to one of the inputs of the adder (16/m).

3. An apparatus according to claim 1, wherein the lattice filter is of the synthesis type, the first and fourth access ports ($A_1$/m, $A_4$/m) of each cell being outputs and the second and third access ports ($A_2$/m, $A_4$/m) being inputs, the first access port ($A_1$/1) of the first cell ($C_1$) being connected to the second access port ($A_2$/1) of the same cell, the cell (C/N) of rank N receiving an input signal at its third access port ($A_3$/N) and each cell comprising:

(a) a subtracter (17/m) having a first input connected to the input ($A_3$/m) of the cell, a second input, and an output connected to the output ($A_1$/m) of the cell;

(b) the first multiplier (11/m) having the first input connected to the subtracter output, and the second input connected to the output of the adaptation circuit (15/m) supplying the coefficient $k_m(t)$, and having an output;

(c) an adder (12/m) having a first input connected to the first multiplier output, a second input connected to the output of the delay circuit (14/m), and an output connected to the output ($A_4$/m) of the cell;

(d) the second multiplier (13/m) having the first input connected to the output of the delay circuit (14/m), and the second input connected to the output of the adaptation circuit (15/m) supplying the coefficient $k_m(t)$, and having an output connected to the second subtracter output and to one of the inputs of the adder (16/m).

4. A predicting circuit according to claim 1, wherein each circuit (15/m) for the sequential adaptation of a coefficient comprises:

a first sign detecting circuit (24) having an input connected to the first input (151) of the adaptation circuit and an output;

a second sign detecting circuit (25) having an input connected to the second input (152) of the adaptation circuit and an output;

an EXCLUSIVE-OR circuit (26) having two inputs respectively connected to the outputs of the first and second sign detecting circuits (24, 25) and an output;

a shift register (27) with several stages and having an input connected to the output of the EXCLUSIVE-OR circuit and two outputs, the first output corresponding to the first stage and the second output corresponding to the final stage;

a first AND gate (28) having two inputs, one input receiving a clock pulse ($H_3$) and the other input connected to the first output of the shift register, and having an output;

a second AND gate (29) having two inputs, one input receiving a clock pulse ($H_1$) and the other input connected to the second output of the shift register, and having an output;

a bidirectional counter (30) having a forward count input connected to the output of the first AND gate (28) and a backward count input connected to the output of the second AND gate (29), and having an output; and a read-only memory (31) having an addressing input connected to the bidirectional counter output, and an output supplying the coefficient k(t).

5. An apparatus according to claim 1, wherein such circuit for the sequential adaptation of a coefficient comprises:

a first sign detecting circuit (32) having an input connected to the first input (151) of the adaptation circuit and an output;

a second sign detecting circuit (33) having an input connected to the second input (152) of the adaptation circuit and an output;

an EXCLUSIVE-OR circuit (34) having two inputs respectively connected to the outputs of the first and second sign detecting circuits (24, 25) and an output;

an algebraic calculation circuit (35) having a first input connected to the output of the EXCLUSIVE-OR circuit, a second input, and an output;

an adder (36) having first and second inputs and an output, the first input being connected to the output of the algebraic calculation circuit;

a delay circuit (37) having an input connected to the output of the adder (36) and an output connected to the second inputs of the algebraic calculation circuit and the adder; and a read-only memory (38) having an input connected to the adder output, and an output supplying the coefficient k(t).

6. An apparatus according to claim 1, wherein each circuit for the sequential adaptation of a coefficient comprises:

a first multiplier (39) having a first input connected to the first input (151) of the adaptation circuit, a second input, and an output;

a first circuit (40) for giving an absolute value having an input connected to the first input (151) of the adaptation circuit and having an output;

a first sign extraction circuit (41) having an input connected to the fourth input (154) of the adaptation circuit and an output connected to the second input of the first multiplier (39);

a second multiplier (42) having a first input connected to the second input of the adaptation circuit, a second input, and an output;

a second circuit (43) for giving an absolute value having an input connected to the second input of the adaptation circuit and an output;

a second sign extraction circuit (44) having an input connected to the third input (153) of the adaptation circuit and an output connected to the second input of the second multiplier (42);

a first adder (45) having two inputs connected respectively to the outputs of the first and second multipliers (39, 42) and having an output;

a multiplier-divider (45) having three inputs, the first input receiving a constant signal, and the second connected to the output of the first adder;

an algebraic calculation circuit (47) having four inputs and an output, the first input receiving a continuous signal, the second input connected to the output of the first circuit (40) for giving an absolute value, and the third input connected to the output of the second circuit (43) for giving an absolute value;

a second adder (48) having a first input connected to the output of the algebraic calculation circuit, a second input, and an output;

a delay circuit (49) having an input connected to the output of the second adder (48) and an output connected to the second input of the second adder and to the fourth input of the algebraic calculation circuit;

a conversion circuit (50) having an input connected to the output of the second adder (48) and an output connected to the third input of the multiplier-divider (46);

a subtracter (51) having a first input connected to the output of the multiplier-divider (46), a second input, and an output supplying the coefficient k(t); and a delay circuit (52) having an input connected to the output of subtracter (51) and an output connected to the second input of said subtracter.

7. An apparatus according to claim 1, wherein each circuit for the sequential adaptation of a coefficient comprises:

a first multiplier (53) having a first input connected to the first input (151) of the adaptation circuit, a second input connected to the fourth input (154) of the adaptation circuit, and an output;

a first circuit (54) for raising to the square having an input connected to the first input (151) of the adaptation circuit and an output;

a second multiplier (55) having a first input connected to the second input (152) of the adaptation circuit, a second input connected to the third input (153) of the adaptation circuit, and an output;

a second circuit (56) for raising to the square having an input connected to the second input (152) of the adaptation circuit and an output;

a first adder (57) having two inputs respectively connected to the outputs of the first and second multipliers (53, 55) and an output;

a multiplier-divider (58) having three inputs and an output, the first input receiving a constant signal, the second input connected to the output of the first adder;

an algebraic calculation circuit (59) having four inputs and an output, the first input receiving a continuous signal, the second input connected to the output of the first circuit (54) for raising to the square, and the third input connected to the output of the second circuit (56) for raising to the square;

a second adder (60) having a first input connected to the output of the algebraic calculation circuit, a second input, and an output;

a delay circuit (61) having an input connected to the output of the second adder (60) and an output connected to the second input of said adder and to the fourth input of the algebraic calculation circuit (59);

a conversion circuit (62) having an input connected to the output of the second adder (60) and an output connected to the third input of the multiplier-divider (58);

a subtracter (63) having a first input connected to the output of multiplier-divider (58), a second input, and an output supplying the coefficient k(t); and a delay circuit (64) having an input connected to the output of the subtracter (63) and an output connected to the second input of said subtracter.

* * * * *

UNITED STATES PATENT AND TRADEMARK OFFICE
CERTIFICATE OF CORRECTION

PATENT NO. : 4,389,726
DATED : June 21, 1983
INVENTOR(S) : Alain Le Guyader and Andre Gilloire It is certified that error appears in the above—identified patent and that said Letters Patent is hereby corrected as shown below:

Column 3, line 37, "use" should read --used--.
Column 4, line 14, "p(t)" should read --$\bar{p}(t)$--.
Column 4, line 53, "in" should read --In--.
Column 6, line 6, "t" should read --$\underline{t}$--.
Column 9, line 55, "current" should read --circuit--.
Column 9, line 64, "e(t)" should read --$\bar{e}(t)$--.
Column 10, line 45, "p(t)" should read --$\bar{p}(t)$--.
Column 10, line 47, "e(t)" should read --$\bar{\bar{e}}(t)$--.
Column 10, line 50, "e" should read --$\bar{e}$--.
Column 11, line 2, "p(t+1) should read --$\bar{p}(t+1)$--.
Column 11, line 54, "current" should read --circuit--.
Column 15, line 1, "$\delta(t)$" should read --$\sigma(t)$--.
Column 15, line 19, "$\delta(t)$" should read --$\sigma(t)$--.
Column 15, line 32 "valuees" should read --values--.

Signed and Sealed this

Twentieth Day of September 1983

[SEAL]

Attest:

GERALD J. MOSSINGHOFF

Attesting Officer    Commissioner of Patents and Trademarks